United States Patent [19]
Toda

[11] Patent Number: 4,942,366
[45] Date of Patent: Jul. 17, 1990

[54] AMPLIFIER DEVICE WITH COUPLED SURFACE EMITTING GRATING

[75] Inventor: Minoru Toda, Lawrenceville, N.J.

[73] Assignee: General Electric Company, Schenectady, N.Y.

[21] Appl. No.: 326,714

[22] Filed: Mar. 21, 1989

[51] Int. Cl.$^5$ .......................... H01S 3/19; H01L 33/00
[52] U.S. Cl. .................... 330/4.3; 350/96.19; 455/612
[58] Field of Search ............... 330/4.3; 455/610, 612; 357/30; 350/96.11, 96.19; 373/96, 102

[56] References Cited

U.S. PATENT DOCUMENTS

| | | | |
|---|---|---|---|
| 4,719,635 | 1/1988 | Yeh | 372/108 |
| 4,730,325 | 3/1988 | Chow | 372/44 |
| 4,760,578 | 7/1988 | Oshima et al. | 372/49 |
| 4,789,881 | 12/1988 | Alphonse | 372/44 |
| 4,793,679 | 12/1988 | Toda et al. | 350/96.15 |
| 4,821,276 | 4/1989 | Alphonse et al. | 372/45 |
| 4,821,277 | 4/1989 | Alphonse et al. | 372/45 |
| 4,833,684 | 5/1989 | Krekels et al. | 372/45 |

OTHER PUBLICATIONS

Kitamura et al.; High-Performance ... LD's; J. Lightwave Technol., Conf. Opt. Fif. Comm., vol. LT-2, #4, pp. 363-369, 8/84, Abst. only.
Kazan et al.; Analysis of ... Gain Induced Waveguiding; J. Opt. Soc. Am., vol. 73, #1, pp. 45-58; 1/83; Abst. only.
Chang et al.; Simplified Approach to ... Gratings; Appl. Opt., vol. 19, #2, 1/15/80; pp. 282-288.
Vermatsu et al.; Grating-Coupled ... Reflectors; Elect. Lett., vol. 13, #25, pp. 759-760; 12/8/77.
G. A. Evans et al., "Efficient 30 mW Grating Surface-Emitting Lasers", Appl. Phys. Lett. 51 (19), Nov. 9, 1987, pp. 1478-1480.
K. Kojima et al., "Edge- and Surface-Emitting Distributed Bragg Reflector Laser with Multiquantum Well Active/Passive Waveguides", Appl. Phys. Lett. 50 (5), Feb. 2, 1987, pp. 227-229.
G. A. Evans et al., Surface-Emitting Second Order Distributed Bragg Reflector Laser with Dynamic Wavelength Stabilization and Far-Field Angle of 0.25° Appl. Phys. Lett. 49 (6), Aug. 11, 1986, pp. 314-315.
N. W. Carlson et al., "Measurement of Effective Index and Dispersion in an Index-Guided Surface-Emitting Distributed Bragg Reflector Laser", Electronics Letters, Mar. 26, 1987, vol. 23, No. 7, pp. 355-357.
IEE Proceedings, vol. 132, Pt. J, No. 1, (A. W. Nelson, et al.) "Design and Fabrication of 1.5 um. Ridge Waveguide Distributed Feedback Lasers" Feb. 1985, pp. 12-19.
Submitted to Optical Fiber Conference, 1988 (K. Kojima, et al.) "Ultrafast Switching Characteristics of Bistable Surface-Emitting Multiquantum well Distributed Bragg Reflector Laser" Central Research Laboratory; Mitsubishi Electric Corporation: Japan.

*Primary Examiner*—Nelson Moskowitz
*Attorney, Agent, or Firm*—Henry I. Steckler; James C. Davis, Jr.; Paul R. Webb, II

[57] ABSTRACT

A surface emitting grating is coupled to an optical amplifier and has grating elements tilted non-normal relative to the amplifier optical axis. The angle of tilt in one embodiment is such that the grating reflections are refracted out of the amplifier region. The amplifier may have a tilted light receiving end serving as an input port in a second embodiment to cause internal reflections from the grating to be reflected to an amplifier boundary at an angle greater than the critical angle to cause the reflections to pass out of the amplifier region. In the latter embodiment, the grating tilt angle is minimized to reduce the surface emission beam angle tilt from the normal to a relatively small angle.

15 Claims, 3 Drawing Sheets

$\angle r_{n+1} - \angle r_n = 2\pi \cos 2\theta$

AMPLIFIER DEVICE WITH COUPLED SURFACE EMITTING GRATING

This invention relates to semiconductor optical devices employing amplifiers and surface emitting gratings.

Of interest are the following copending applications all assigned to the assignee of the present invention. Ser. No. 263,464 filed Oct. 27, 1988 entitled "A Grating-coupled Surface-emitting Superluminescent Device" by G. Evans et al.; Ser. No. 230,105 filed Aug. 9, 1988 entitled "Surface emitting Lasers With Combined Output" by D. B. Carlin; Ser. No. 040,977 filed Apr. 20, 1987, now U.S. Pat. No. 4,821,277, entitled "Super-luminescent Diode" by G. A. Alfonse et al.; Ser. No. 040,979 filed Apr. 20, 1987, now U.S. Pat. No. 4,821,276 entitled "Super-luminescent Diode" by G. A. Alfonse et al.; Ser. No. 040,978 filed Apr. 20, 1987, now U.S. Pat. No. 4,789,881 entitled "Low Coherence Optical System Having Reflective Means" by G. A. Alfonse; Ser. No. 040,976 filed Apr. 20, 1987, now U.S. Pat. No. 4,793,679 entitled "Optical Coupling System" by M. Toda et al. and Ser. No. 07/316,209 filed Feb. 27, 1989 entitled "Optical Device with Mode Selecting Grating" by S. L. Palfrey et al.

Semiconductor optical amplifier devices are often used with optical waveguides for processing light beams which are used to couple various circuit elements in an optical circuit system. For example, such a system may include optical computers in which beams are projected to various spaced components. A primary waveguide propagates a light beam from a source to a target region. Amplifiers are optically coupled to the waveguide for amplifying light which otherwise would be significantly attenuated by the various couplings in the system. The amplifiers may be coupled to light emitting devices, i.e., gratings, for amplifying and transmitting the amplified light to other circuit components.

Often surface emitters in semiconductor lasers employ surface emitting distributive feedback (DFB) and distributive Bragg reflectors (DBR) gratings. A second order DBR grating couples light out in first order an provides laser feedback in second order. An article entitled "Surface-emitting Second Order Distributive Bragg Reflector with Dynamic Wavelength Stabilization and Far-field Angle of 0.25°" by G. A. Evans et al., Applied Physics Letter 49(6) Aug. 11, 1986 pp. 314–315, states such laser devices have peak grating coupled output powers up to 4 mW. Other DBR and DFB gratings are known for use with laser devices. These gratings are advantageous for use with laser devices in that the feedback is optimum.

However, in an amplifier of the type employed in optical circuits, while employing amplification principles the same as that used in lasers and in super-luminescent diodes discussed in several of the aforementioned copending applications, reflections produced by DBR and DFG gratings are undesired. Such reflections cause oscillations in the amplifier and once oscillation occurs, the amplifier gain is limited. The advantages of using a surface emitting grating are discussed in the aforementioned article by Evans et al. However, due to the disadvantages due to oscillations produced by the feedback from normal DFB and DBR gratings, such gratings are undesirable for use in amplifiers in optical circuits. The present inventor recognizes a need for an amplifier having a relatively high gain and linearity employing a surface emitting grating while at the same time suppressing reflections, and therefore, oscillation and the attendant loss of gain and linearity.

An optical device according to the present invention comprises a semiconductor optical amplifier having an optical axis intersecting opposite amplifier ends. The device further includes a surface emitting optical grating comprising a plurality of elements optically coupled to the amplifier at an output end of the amplifier. The grating and the input end of the amplifier are so arranged relative to the optical axis such that at least one of the amplifier input end and the grating are oriented non-perpendicular to the optical axis at a first angle to suppress light oscillations in the amplifier.

In a further improvement, the other of the input end of the amplifier and grating is oriented non-perpendicular to the axis at a second angle. The angle of the grating has a value such that light is reflected from the grating into the amplifier non-parallel to the optical axis. The angle of the input end has a value such that reflected light is reflected from the input end to a boundary of the amplifier between the ends at an angle greater than the critical angle for that boundary to transmit light out of the amplifier.

Figure 1:
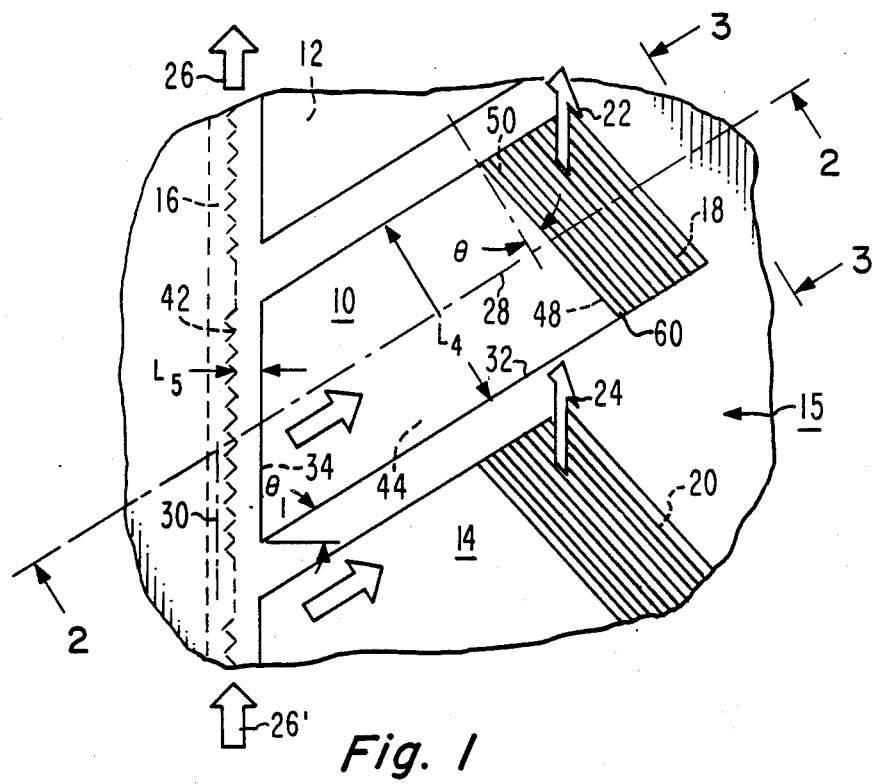
FIG. 1 is a plan view of a portion of an array of amplifier devices each with a coupled surface emitting grating according to one embodiment of the present invention.

In FIG. 1, device 10 is one of a plurality of devices 12, 14 and so forth in an array 15 of optical devices, for example, about ten devices. More or fewer than ten devices 10, 12, 14 and so forth, depending on the design, may be in a given array. However, in the alternative, device 10, FIG. 1, may be utilized singly in accordance with a given implementation rather than in an array. The devices in array 15 are optically coupled to a waveguide 16 for amplifying the received light. Each device has a surface emitting grating, for example, device 10 has a grating 18; device 14 has a grating 20 and so forth. Device 1 emits a beam 22 from grating 18 and device 14 emits a beam 24 from grating 20. The beams 22, 24 and so forth from all of the devices of the array 15 form a composite beam of relatively high intensity for use in optical communications in optical circuits, for example, optical computers (not shown).

The array 15 may be just one of a plurality of arrays on a given substrate for amplifying beam 26 transmitted by the waveguide 16. The waveguide 16 is a portion of a larger waveguide in a larger optical system. The waveguide has present therein a beam 26' which is transmitted by the waveguide 16 portion. The array 15 devices tap portions of the beam 26'. This tapping of portions of the light attenuates the beam 26' so that the downstream beam 26 is of lower intensity value than that of the upstream beam 26'. However, beam 26 is required to be transmitted through the remainder of the waveguide 16 (not shown) for operation in other circuits which may be present on the substrate containing array 15. Each of those other circuits may undesirably further attenuate beam 26.

Each of the devices of the array 15 amplify the otherwise attenuated beam 26' received from waveguide 16 prior to generating beams 22, 24 and so on. The amplifier portion of the devices, such as device 10, is to be differentiated from a laser. Oscillations of light in the amplifier cause suppression of amplification, unlike lasers in which oscillations are desired.

An example of a laser device employing a surface emitting distributed Bragg reflector grating is shown in Applied Physics Letter 49 Vol. 6, Aug. 11, 1986 pp. 314–315. A surface emitting second order distributed Bragg reflector (DBR) laser is shown with parallel grating elements oriented normal to the optical axis of the laser device where the grating is located outside of the active (amplifying) region emitting beams externally in addition to reflecting light to the device. Surface emitting distributed feedback (DFB) gratings operate similarly but the grating is over the active region. The internal reflection has a vital role in laser oscillations. In contradistinction, the reflections from DBR or DFB gratings cause deleterious operation of an amplifier.

To assist in suppression of oscillations, the grating 18 of representative device 10 is tilted at an angle $\theta$ relative to the optical axis 28 of device 10. The gratings of the other devices of array 15 are tilted similarly. Angle $\theta$ has a value such that the reflections are in a direction non-parallel to axis 28 so as to be refracted out of the amplifier portion of the device 10. Beam 22 is emitted as close to the normal to the plane of grating 18 as possible. This will be discussed in detail later. To make the angle $\theta$ relatively large would cause the beam 22 to be tilted in a direction more parallel to the plane of the grating 18 which is undesirable because this tends to make the structural design more difficult, i.e., the orientation of the receiving detector is more difficult. For this purpose, it is desirable that the beam 22 be normal to the plane of the grating 18. To make the beam 22 normal would also require the grating elements of grating 18 to also be normal to axis 28. Therefore, tilting the grating takes into consideration these two opposing factors and the angle of tilt angle $\theta$ is a compromise of those two factors.

To alleviate the condition of tilting the beam 22 more parallel to the plane of the grating 18 elements, the device 10 optical axis 28 is tilted angle $\theta_1$ so that the device 10 optical axis 28 is non-normal to the optical axis 30 of waveguide 16 at the region of coupling to the waveguide. The combination of angles $\theta$ and $\theta_1$ are determined considering the following. The reflected light from grating 18 is incident on the boundary 32 of the device 10, reflected and again reflected by the device 10 optical wave input end 34 adjacent to the waveguide 16. The light rays reflected from end 34 are incident on the boundary 32 a second time and refracted out of the device 10. Therefore, oscillations of light rays in the amplifying region caused by reflections of light from grating 18 are suppressed, maximizing the amplifying function. All of this will become clearer upon explanation of the details of device 10 below.

Figure 2:
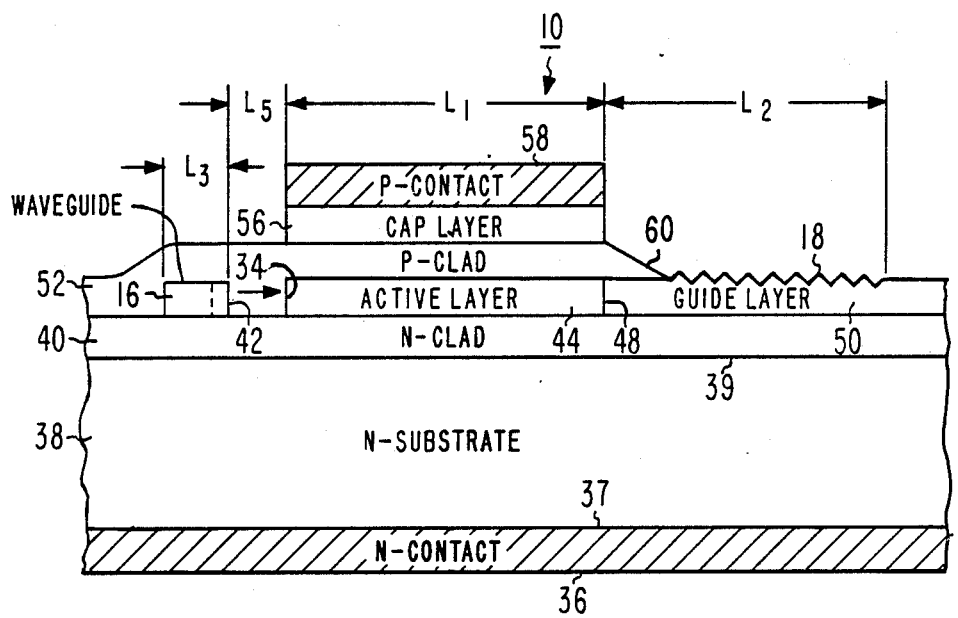
FIG. 2 is a section elevation view of the embodiment of FIG. 1 taken along lines 2—2.

In FIG. 2, representative device 10 will be described with the understanding that the remaining devices 12, 14 and so forth of the array 15 coupled to waveguide 16 are constructed similarly. Device 10 comprises an N contact 36, such as sintered Ni/Ge/Ti/Au, deposited on one broad planar surface 37 of substrate 38. Substrate 38 may be GaAs, of N conductivity type, and a thickness of about 200$\mu$ (micrometers). Over a second planar broad surface 39 of the substrate 38 is a first cladding layer 40 which is of N conductivity type. The cladding layer 40 may comprise $Al_xGa_{1-x}As$ where x preferably is about 0.3. The cladding layer 40 may have a thickness of 0.5$\mu$. Overlying the cladding layer 40 is waveguide 16 which may have a thickness of 0.2$\mu$ and a transverse width $L_3$ of 2$\mu$. The waveguide 16 may comprise $Al_yGa_{1-y}As$ where y is preferably about 0.15.

Waveguide 16, FIG. 1, has a corrugated edge formed with corrugations 42 for emitting light along optical axis 28 to the device 10. The corrugations 42 are constructed such that the light emitted therefrom is parallel to axis 28. The corrugations 42 extend in a direction parallel to the waveguide 16 axis 30 for a length sufficient to provide optical coupling along the width of the device 10, dimension $L_4$. Dimension $L_4$ may have a value of about 100$\mu$. The peaks of the corrugations 42 may be spaced from the device 10 end 34 a distance $L_5$ generally of about 0.1$\mu$.

Overlying the cladding layer 40 spaced distance $L_5$ from the waveguide 16, FIG. 2, is active layer 44. Active layer 44 may comprise non-doped GaAs having a thickness of 0.2$\mu$. The layer 44 has a length $L_1$ generally of about 200–500$\mu$. It is to be understood that this length is different across the width dimension $L_4$ due to the angles $\theta$ and $\theta_1$ of the respective ends 34 and 48 of the active layer to a normal to axis 28. The length $L_1$ of the active layer therefore is a nominal value. Guide layer 50 abuts and is optically coupled to end 48 of active layer 44 and overlies cladding layer 40. Guide layer 50 is the same thickness as active layer 48 and of the same transverse width dimension $L_4$. Guide layer 50 may comprise the same material as that of the waveguide 16. Overlying the first cladding layer 40, waveguide 16 and active layer 44 is a second cladding layer 52. Cladding layer 52 is of P-conductivity and comprises $Al_xGa_{1-x}As$. The P-cladding layer near the grating area gradually thins at transition region 60. This provides effective coupling of the active region to the guide region. Grating 18 is directly on the surface of guide layer 50. The grating 18 is oriented at angle $\theta$ (FIG. 1) relative to the optical axis 28 of the active layer 44. The elements of the grating 18 are linear and parallel.

A cap layer 56 is over the cladding layer 52 in the region of active layer 44. Cap layer 56 is P-conductivity GaAs. A P-contact 58 overlies cap layer 56. The P-contact 58 may comprise successive layers of Ti/Pt/Au, with the Ti layer next to the layer 56. The length dimension $L_2$ (FIG. 2) of the grating may be about 50–100$\mu$. The grating 18 has a peak-to-valley amplitude of about 0.05$\mu$.

The device of this embodiment can be made by an epitaxial process with appropriate reagents and doping. Grating 18 is formed by etching the guide layer 50.

Figure 3:
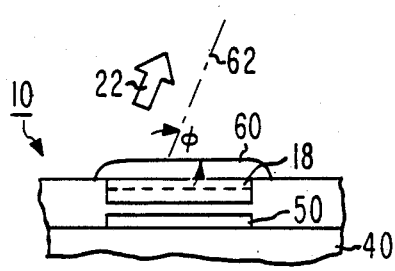
FIG. 3 is a partial elevation view of the embodiment of FIG. 1 taken along lines 3—3.
Figure 4:
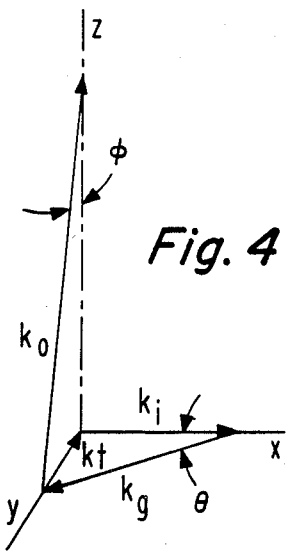
FIG. 4 is a diagram representing various light beams generated in the embodiment of FIG. 1 useful for explaining some of the principles of the present invention.
Figure 5:
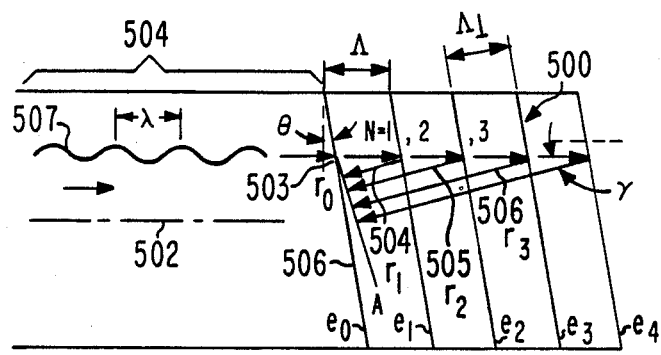
FIG. 5 is a diagramatic view of light wavefronts as they relate to the grating employed in the embodiment of FIG. 1 for purposes of further explaining some of the principles of the present invention.
Figure 6:
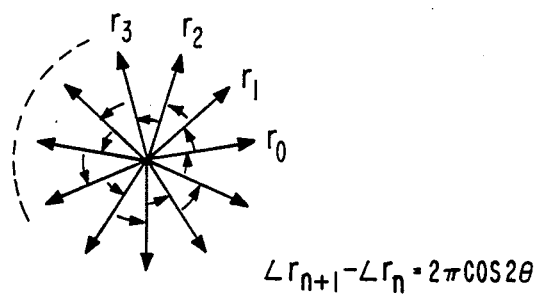
FIG. 6 is a vector diagram of the phase relationship of the reflected light beams from a grating similar to the grating of the embodiment of FIG. 5.

In FIG. 3, the beam 22 emitted by device 10 has an optical axis 62. Axis 62 is tilted angle $\phi$ which is a function of angle $\theta$ of the tilt of the grating relative to the optical axis 28. The relationship of the angles $\theta$ and $\phi$ will now be discussed with reference made to FIGS. 4, 5, and 6. In FIG. 5, in a conventional grating radiator having grating elements normal to optical axis 502 (when $\theta=0$), the periodicity $\Lambda$ of the grating is the same as that of wavelength $\lambda$ of the guided wave such that radiation is emitted normal to the surface. A large portion of the guided wave is also reflected back to the guide because the Bragg condition is satisfied. Therefore, a grating whose corrugations are parallel to the propagation wavefront cannot be used as an output or input coupler to an amplifier because of the oscillations and their effect, as discussed above. This type of grating is used for surface emission DBR lasers because it requires strong reflections from the grating to the active region.

However, it can be shown that the Bragg reflection tends to be significantly reduced when the periodicity of a non-tilted grating is slightly different from the above condition, i.e., not equal to that of wavelength $\lambda$. However, reflections from the grating region are present because the average thickness of the layer where the grating is formed is less than the thickness of the remaining portion of the clad layer 52 (FIG. 1) with no grating because the grating is etched from layer 52. The reflections are weaker than Bragg reflections but reflections are present, e.g., 10%, and this reflectivity limits the amplifier gain.

In FIG. 5, grating 500 having linear parallel grating elements $e_o - e_n$ is tilted at angle $\theta$ relative to a normal to the light propagation axis 502. $\theta$ has a value which does not satisfy the Bragg condition and exhibits a weaker reflection. The reflections do not reflect parallel to axis 502 into the amplifier region 504 because of the angle $\gamma$ of the reflections. The periodicity of the grating 500 in a direction perpendicular to the grating elements is $\Lambda_\perp$ and the periodicity in the wave propagation direction is $\Lambda$ which is $\Lambda_\perp/\cos\theta$ and is larger than $\Lambda_\perp$. The wave 507 of wavelength $\lambda$ in the gain region propagates parallel to the optical axis and is chosen so as to be equal to $\Lambda$. The phase of the reflections 503, 504 ... 505$_n$ from each respective grating element $e_o - e_N$ is expressed as a vector and each reflection signal is given by:

$$r_o = \sin(\omega t - \phi) \quad (1)$$

at the initial grating element $e_o$;

$$r_1 = \sin(\omega t - (\phi + 2 \cdot 2\pi + 2\pi \cos 2\theta)) \quad (2)$$

at element $e_1$;

$$r_2 = \sin(\omega t - (\phi + 2 \cdot 2\pi + 2 \cdot 2\pi \cos 2\theta)) \quad (3)$$

at element $e_2$; and $$r_N = \sin(\omega t - (\phi + 2N\pi + 2N\pi \cos 2\theta)) \quad (4)$$

at element $e_N$.

The term $2N\pi$ is the path length in the grating region before the wave is reflected and the term $2N\pi \cos 2\theta$ is the path length to line A. Each pair of adjacent vectors ($r_N$ and $r_{N-1}$ or $r_N$ and $r_{N+1}$) are radially spaced the same angle $2\pi \cos 2\theta$, FIG. 6. The summation of $$r_N \overset{\infty}{\underset{N=0}{\Sigma}} r_N$$

becomes zero for any value of tilt angle $\theta$ except for $\theta = 45°$, where Bragg reflection occurs.

The angle of the radiation reflected from a tilted grating can be calculated employing wave vectors. As seen in FIG. 4, the incident wave vector $K_i$ ($=2\pi/\lambda$) parallel to axis 502 (FIG. 5) and the grating vector $k_g$ ($=2\pi/\Lambda_\perp$) normal to the grating lines, (FIG. 5), satisfy $k_g \cos 2\theta = k_i$ and the resultant vector $K_t$ is equal to $k_g - k_i$. If $K_t < k_o$ ($k_o$ is the wave vector to outer space corresponding to beam 22, FIG. 1), radiation into the ambient atmosphere takes place and the angle $\phi$ is found from the relation $k_o \sin \phi = k_i \tan \theta$.

At a very large driving current applied to a single spatial mode stripe laser, the device temperature and carrier temperature increase which leads to carrier leakage from the energy barrier of a double heterostructure. Other kinds of problems include formation of a defect or dark lines inside of the junction or catastrophic damages on a laser facet. All of these are caused by high energy density at high power level. If the stripe width is increased in order to reduce the power density, the laser cannot be operated in a single mode condition.

In the case of an amplifier, a large width (dimension $L_4$, FIG. 1) amplifying region does not cause multimode operation if excitation is in a single spatial mode. However, a suitable method of coupling from a single spatial mode laser to wide width amplifier is necessary. This may be done using an integrated lens (not shown) which converts a diverging beam from a laser to a parallel beam on a surface waveguide, or phased array laser (not shown) may be directly coupled to a wide width amplifier. A preferred arrangement is to provide a phase grating, such as corrugation 42 (FIG. 1), at a side of a narrow width waveguide such as waveguide 16, (FIG. 1), so that the propagating wave in the narrow waveguide 16 radiates into a relatively wide width amplifying region tilted relative to the narrow waveguide as shown, by way of example.

Figure 7:
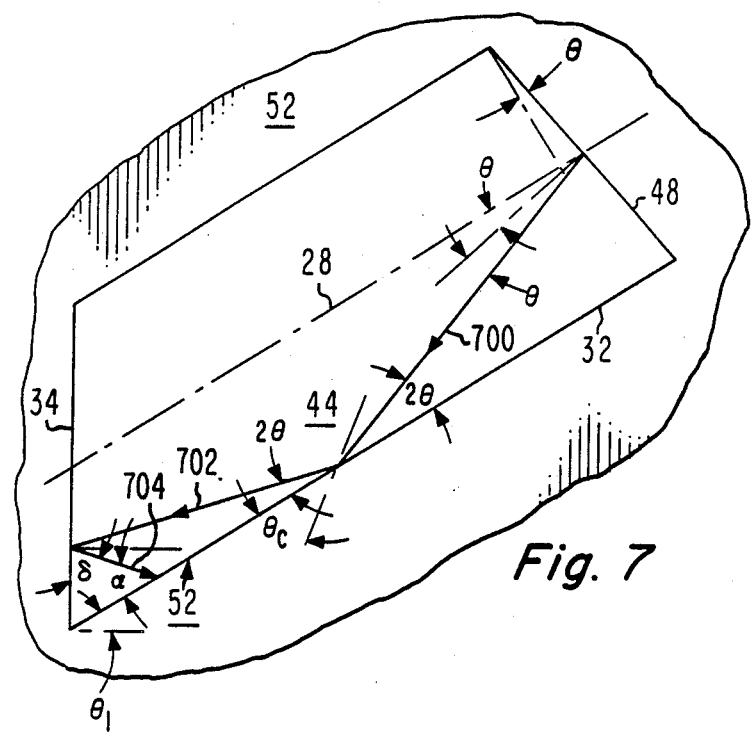
FIG. 7 is a schematic diagram of the amplifier region of the embodiment of FIG. 1 of one of the amplifier devices for explaining certain additional principles of the present invention.

In FIG. 7, to minimize the angle $\theta$, axis 28 is oriented at angle $\theta_1$ relative to a normal to the device end 34 receiving the beam from the waveguide 16. By employing reflections of light from the boundary 32 between the active layer 44 and remaining semiconductor material, for example, the P cladding layer 52, light may be reflected from the grating region through end 48 ray 700, to the boundary 32 and reflected from the boundary to end 34 ray 702.

It can be shown that when ray 702 is reflected from end 34 it creates ray 704 which is incident upon the boundary 32 at an angle $\alpha$ greater than the critical angle $\theta_c$ for the total reflection and is refracted through boundary 32. Assume the angle $\theta$ exceeds a certain value such that the angle of incidence of the reflections from the gratings, e.g., ray 700, are incident on the boundary 32 at a value greater than the angle $\theta_c$. It is believed here that the grating 18 may be tilted at such a large angle that $\phi$ would cause the rays of the beam 22 to be tilted more than desired, i.e., unacceptably tilted. If the angle $2\theta$ at which the ray 700 reflected from the grating is smaller than the angle $\theta_c$, then the rays 700 will completely reflect from the boundary 32 and be incident upon end 34. These rays are then reflected from end 34 at angle δ and impinge upon boundary 32 at angle α. By making the angle α somewhat greater than the critical angle $\theta_c$, then the ray 704 incident on boundary 32 from end 34 is refracted out of the active layer 44. This action tends to reduce the possibility of internal oscillations in the amplifier.

Light incident on a boundary of materials of different indices of refraction at less than the critical angle $\theta_c$ is totally reflected internally. Light incident on the boundary at a value greater than the critical angle is mostly transmitted through the boundary with relative increasing transmission through the boundary proportional to the increase of the incident angle greater than the critical angle. The angle $\theta_c$ is determined by the effective index of refraction of the active layer 44 to the effective index of refraction of the boundary material, cladding 52. The effective refractive index of the active layer is a function of the thickness of the active layer and also of the external material at the boundry. The differences in effective index of refractions serve as a boundary which tend to confine radiation within the active layer 44 of the device, providing total internal reflection which is undesirable in the amplifier of the present invention. Therefore, the angle θ and the angle $\theta_1$ have such combined values that α is greater than the critical angle $\theta_c$ and thus, greater than 2θ, to prevent reflections in the active layer 44. The critical angle θ is determined as follows:

$$\theta_c = \cos^{-1}(n_2/n_1) \quad (5)$$

where $n_1$ is the effective refractive index of the active layer 44 for 0.2μ thick GaAs and is typically 3.496 and $n_2$ is the effective refractive index of the adjacent cladding 52 typically 3.4 for $Al_{0.3}Ga_{0.7}As$, and $\theta_c = 13.5°$. The angles 2θ or α should be greater than $\theta_c$. When $2\theta = \theta_c$, the tilt angle of the radiation φ becomes 24.3°.

In operation, in FIG. 2, a positive voltage is applied to the P contact 58 and a negative voltage to the N contact 36. Holes are injected from the P contact 58 into the active layer 44 with cladding layer 40 providing a barrier against further movement by the holes. Similarly, electrons are injected from the N contact 36 into the active layer 44. At a threshold current, population inversion occurs and, therefore, the incident light beam is amplified by the stimulated emission of photons. Photons generated in the active layer 44 are emitted to the guidelayer 50 and are incident on the second order grating 18. The photons are emitted as beam 22 non-perpendicular to the guidelayer 50.

Because of the reduction of the reflections under practical limitations as illustrated above in connection with FIG. 7, device 10 operates as an amplifier. If the beam 22 can be closer to parallel to the plane of grating 18, then the angle θ may be made that value at which the value 2θ is greater than the critical angle $\theta_c$. In this case, end 34 need not be made an angle $\theta_1$ less than 90° to the optical axis 28 from the above discussions as there will be negligible reflections to and from end 34. Normally, however, adjacent optical devices in an optical computer, for example, require the output from the grating to be as close to normal to the grating surface as possible. Therefore, the angle θ should be kept as small as possible for this purpose. Generally, the angle θ may be about 10° for this purpose.

There is another advantage of having $\theta_1 < 90°$. The light radiated from the grating 18 goes through some optical component such as lenses and is finally fed to a detector. From these components, external reflections may return to the grating 18 and coupled to the amplifier. If these externally caused reflections reach the end 34 which is otherwise normal to the axis 28 ($\theta_1 = 0$), these reflections from end 34 are amplified and the light oscillates in the amplifier. If the gain of the amplifier is sufficiently high, these type of reflections cause spurious oscillations. Thus, the tilted angle ($\theta_1 < 90$) of the end 34 has a second function.

Figure 8:
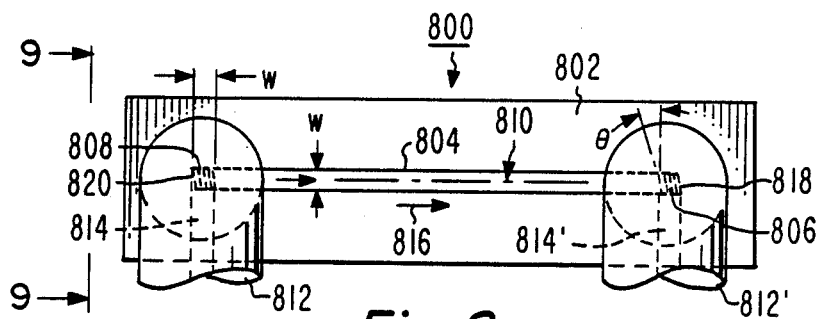
FIG. 8 is a plan view of a second embodiment of a device according to the present invention.

FIG. 8 illustrates a second embodiment of the present invention. A coupling between single mode fibers in waveguide amplifiers has the same problem as the coupling efficiency and alignment tolerance of a laser fiber coupling. The device of FIG. 8 addresses these coupling problems. Device 800 includes amplifier 804 disposed in a semiconductor body 802. The amplifier 804 may be constructed similarly as device 10, FIGS. 1 and 2. The active region of the amplifier is sandwiched between two clad regions corresponding to the clad layers 40 and 52, FIG. 2, with gratings located at both ends. These layered structures are not shown but it is assumed that the construction of the waveguide layer, active layer, grating layer and cladding layers are similarly reproduced in the embodiments of FIGS. 8 and 9.

Amplifier 804 is of a given desired length with the gratings 806 and 808 at opposite ends of the waveguide 804. The gratings 806 and 808 are formed directly on the guide layer 50 as discussed above in connection with the embodiment of FIG. 2. The grating elements of the gratings 806 and 808 are tilted relative to the optical axis 808 in a manner similar to the tilt of grating 18 to axis 28. The angle of tilt may be the angle θ as discussed above in connection with FIG. 7.

Device 800 further includes two optical fibers 812 and 812'. Fiber 812 has a core 814 and fiber 812' has a core 814'. The core 814 is over grating 808 and coupled thereto and core 814' is over grating 806 and coupled thereto. Fiber 812 may serve, for example, as an input of an optical signal to the device 800 and the fiber 812' may serve as an output for the device signal transmitted by the device 800 from grating 808 to grating 806 in the direction of arrow 815. Ends 818 and 820 of the amplifier 804 are tilted so that they are not perpendicular to the waveguide 804 optical axis 810. The tilt angle of the ends 818 and 820 may be the same value so that both gratings are parallel and the angles of the fibers are the same for both. This makes the structure simpler to manufacture. The angle of the gratings 818 and 820 to the optical axis 810 should have a value such that the reflections at the interface between the waveguide 804 and the adjacent material body (clad) are at an angle greater than the critical angle $\theta_c$. The tilt angle is such that twice the angle of tilt is by some value greater than the critical angle $\theta_c$. Angle θ of the gratings will cause the beam emitted from the emission grating 806 and the beam received by the receiving grating 808 to be an angle tilted from the perpendicular to the plane of the surface of the gratings. This tilt, angle φ', FIG. 9, can be estimated exactly the same way as for the angle φ, FIGS. 3 and 4. The optical fiber 812 and its core 814 are also tilted at angle φ' to transmit the beam to grating 808.

Figure 9:
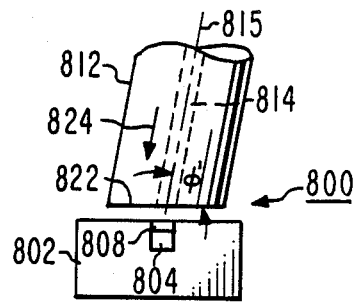
FIG. 9 is an end view of the device of FIG. 8 taken along lines 9—9.

Fiber 812, which is representative, has an end face 822, FIG. 9, which is polished at an angle φ' to the fiber optical axis 815. The light propagation axis 815 of the fiber 812 is parallel to the light reception (or emission) axis of the beam to grating 808 in the direction of arrow 824. The light propagating in the grating region is converted to radiation due to the effect of the grating.

The widths of the amplifier and the coupling region are equal to the size of a single mode fiber core and the length of the coupling region relates to the fiber core diameter so that an angle polished fiber or cleaved fiber can be directly coupled without lenses. Direct coupling has a higher coupling efficiency than a lensed fiber. As near field patterns of the radiator and the fiber agree, coupling efficiency becomes 100% from overlap integration theory.

It is important that reflections between the gratings 806 and 808 along the waveguide 804 are reduced as much as possible within an acceptable range of the tilt of the coupled in or out beams. Therefore, the angle $\theta$ becomes important to eliminate or otherwise minimize the reflections as discussed above. If necessary, the ends 818 and 820 may be made at angles different than each other for an acceptable tilt of the fibers as already discussed. Further, while the gratings 806 and 808 are discussed as having a common tilt angle $\theta$, it should be recognized in certain implementations they may have different tilt angles depending on the reflection characteristics and the angles of the coupled fibers at the emission and receiving gratings. The important consideration is that the reflections internal in the waveguide including an amplifier are minimized to maximize amplifier gain.

What is claimed is:

1. An optical device comprising:
    a semiconductor optical amplifier having an optical axis intersecting opposite amplifier ends; and
    a surface emission optical grating comprising a plurality of elements optically coupled to the amplifier at one of said ends, said grating having grating elements oriented non-perpendicular to said optical axis at a first angle, the amplifier and said grating orientation angle being arranged to reflect light out of said amplifier.

2. The device of claim 1 wherein the elements of said grating are arranged in an array lying in a plane substantially parallel to said optical axis.

3. The device of claim 1 wherein said amplifier is formed in a semiconductor body, said grating being formed in said body contiguous to said amplifier.

4. The device of claim 1 wherein the other end of the amplifier is non perpendicular to said axis at a second angle, the first angle having a value such that light tends to be reflected from the grating into the amplifier non parallel to the optical axis, said second angle having a value such that said reflected light reflects from said other end to a boundary of the amplifier between said ends at an angle greater than the critical angle for that boundary to refract said reflected light from said other end out of said amplifier.

5. The device of claim 1 wherein said first angle has a value such that light from the amplifier reflected by said grating back into said amplifier is incident on a side boundary of the amplifier with adjacent material between said ends at an angle greater than the critical angle.

6. The device of claim 1 wherein said device is formed in a body of semiconductor material, said material including a spaced array of a plurality of said devices.

7. The device of claim 6 wherein the devices are parallel and spaced to form effectively a single beam.

8. The device of claim 1 further including an optical waveguide adjacent to the amplifier end opposite said one end and means for emitting light from the waveguide to said amplifier.

9. The device of claim 8 wherein said means for emitting light includes means for emitting light parallel to said axis.

10. The device of claim 1 further including an undulating region optically coupled to the amplifier at the other of said ends.

11. The device of claim 10 wherein said gratings have elements that lie in substantially parallel arrays.

12. The device of claim 10 wherein the gratings have elements that are substantially parallel.

13. An optical amplifier device comprising:
    a body of semiconductor material having a broad surface and an optical axis parallel to the surface, said body being adapted for receiving incident an optical wave propagating along said axis and including means for amplifying said incident optical wave along said optical axis in an amplifying region of the body, said amplifying region having an optical wave input end lying in a plane at a first angle to said axis; and
    surface emission grating means secured to said body for emitting said amplified optical wave away from said body surface, said grating means comprising a plurality of parallel grating elements lying in a plane parallel to said optical axis, said elements tending to reflect radiation into said amplifying region, said grating elements being oriented at a second angle relative to said axis, said elements refracting a portion of said amplified radiation from said surface and reflecting a portion of said amplified radiation into said amplifying region, said first and second angles having values such that oscillation of reflections from said elements within said amplifying region is suppressed.

14. The device of claim 11 wherein at least one of said first and second angles has a value such that internal reflections incident on at least one boundary of said amplifying region and the adjacent semiconductor body is at an angle whose value is greater than the critical angle value such that the optical wave is transmitted through that boundary out of the amplifying region.

15. The device of claim 14 wherein the values of the first and second angles are such that the optical wave is reflected from said elements into said at least one boundary at less than said critical angle and reflects from said receiving end, said radiation reflected from said receiving end impinging upon said boundary at an angle which is greater than said critical angle.

* * * * *